US005525929A

United States Patent [19]
Nagahori et al.

[11] Patent Number: 5,525,929
[45] Date of Patent: Jun. 11, 1996

[54] TRANSIMPEDANCE AMPLIFIER CIRCUIT WITH FEEDBACK AND LOAD RESISTOR VARIABLE CIRCUITS

[75] Inventors: Takeshi Nagahori; Ichiro Hatakeyama, both of Tokyo, Japan

[73] Assignee: NEC Corporation, Tokyo, Japan

[21] Appl. No.: 343,346

[22] Filed: Nov. 22, 1994

[30] Foreign Application Priority Data

Nov. 24, 1993 [JP] Japan .................................. 5-293249

[51] Int. Cl.$^6$ .............................. H03F 1/34; H03G 3/30
[52] U.S. Cl. ........................... 330/110; 330/282; 330/308
[58] Field of Search ............................ 330/59, 110, 282, 330/308; 250/214 A, 214 AG

[56] References Cited

U.S. PATENT DOCUMENTS

| | | |
|---|---|---|
| 4,612,514 | 9/1986 | Shigaki et al. ...................... 330/282 X |
| 5,030,925 | 7/1991 | Taylor . |
| 5,363,064 | 11/1994 | Mikamura .............................. 330/308 |

FOREIGN PATENT DOCUMENTS

| | | |
|---|---|---|
| 0262986 | 4/1988 | European Pat. Off. . |
| 056880 | 11/1993 | European Pat. Off. . |
| 59-50632 | 3/1984 | Japan . |
| 163508 | 8/1985 | Japan ..................................... 330/308 |
| 61-43004 | 3/1986 | Japan . |
| 4306904 | 10/1992 | Japan . |

OTHER PUBLICATIONS

Sudou et al., "Experiment of Miniaturized PIN–AMP Module with Wide Dynamic Range", 4th Separated vol. of Collected Lecture Theses, Spring Nat'l. Conv., Inst. of Electronics, Information and Communication Engineers of Japan, 1992, p. 177.

Mikamura et al., "Low Noise and Wide Dynamic Range GaAs Preamplifier IC for Optical Communication", Tech. Study Report CS92-10, Inst. of Electronics, Information and Communication Engineers of Japan, pp. 61–68 Oct. 1992.

*Primary Examiner*—James B. Mullins

[57] ABSTRACT

A transimpedance amplifier circuit for converting an input current to an output voltage includes a feedback resistor variable circuit which is connected in parallel to a feedback resistor and a load resistor variable circuit which is connected to a collector of an amplifying transistor. The feedback resistor variable circuit includes a first resistor and a first P-N junction diode connected in series. After the first P-N junction diode turns on in accordance with the increase in the input current, the transimpedance is decreased. As a result, a wide input dynamic range can be achieved. The load resistor variable circuit includes a reference voltage source and a series circuit of a second P-N junction diode and a second resistor. After the second P-N junction diode turns on in accordance with the increase in the input current, an effective load resistance value of the amplifying transistor is decreased, whereby the gain of the amplification transistor is decreased. The transimpedance amplifier circuit has an increased input dynamic range, a sufficient phase margin while low noise characteristics are maintained. Further, because the transimpedance amplifier circuit adopts a P-N junction diode, it is less susceptible to the influence of variations in characteristics of the elements.

7 Claims, 13 Drawing Sheets

TRANSIMPEDANCE AMPLIFIER CIRCUIT WITH FEEDBACK AND LOAD RESISTOR VARIABLE CIRCUITS

BACKGROUND OF THE INVENTION (1) Field of the Invention

This invention relates to a transimpedance amplifier circuit for use as a front end amplifier of a burst-signal adaptable optical receiver, which requires a wide dynamic range, of an optical transmission system in a subscriber's Passive Optical Network (PON) system and so on.

(2) Description of the Related Art

In order to increase a dynamic range in an optical receiver, it has been known to vary a feedback resistance value of a transimpedance amplifier circuit, used as a front end amplifier of a receiving circuit, in accordance with the magnitude of an input signal level. Such technique is disclosed in, for example, Japanese Patent Application Kokai Publication No. Sho-59(1984)-50632.

Figure 1:
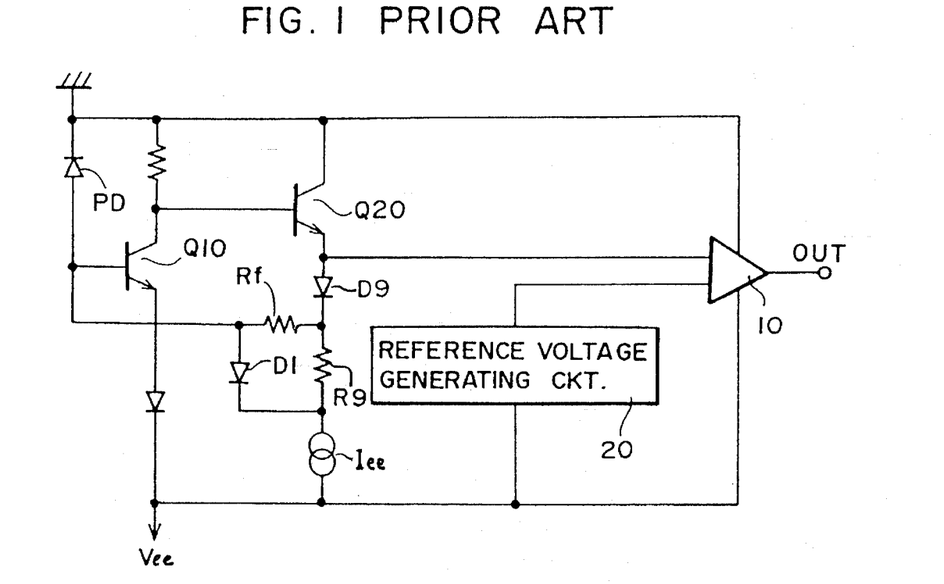
FIG. 1 is a block diagram showing a circuit configuration of a conventional transimpedance amplifier circuit of a variable feedback resistance type.

One exemplary configuration of a conventional transimpedance amplifier circuit of a variable feedback resistance type will now be described. FIG. 1 shows a variable feedback resistance type transimpedance amplifier circuit as disclosed on page 177 of the Fourth Separated Volume of Collected Lecture Theses from the Spring National Convention by the Institute of Electronics, Information and Communication Engineers (IEICE) of Japan in 1992. In this variable feedback resistance type transimpedance amplifier circuit, a light receiving element such as a photo-diode PD is connected between a base of a first transistor Q10 and the ground. A collector of the first transistor Q10 is connected to a base of a second transistor Q20. A diode D9, a resistor R9 and a constant-current source $I_{ee}$ are connected in series between an emitter of the transistor Q20 and the power source $V_{ee}$. Also, a feedback resistor Rf is coupled between the base of the transistor Q10 and the connection node between the resistor R9 and the constant-current source $I_{ee}$. A diode D1 for varying a feedback resistance value is connected in parallel to the feedback resistor Rf and the resistor R9, thereby constituting a variable feedback resistor circuit. One input terminal of an output buffer 10 is connected to the emitter of the transistor Q20, whilst the other input terminal thereof is connected to a reference voltage generating circuit 20. An output terminal of this output buffer 10 is connected to an output terminal OUT of the transimpedance amplifier circuit. A current flowing through the light receiving diode PD increases in proportion to an increase in the intensity or level of an optical input signal, and hence a current to be inputted to the transimpedance amplifier circuit is increased.

When the diode D1 turns on according to the increase of the input current to the transimpedance amplifier circuit, the transimpedance is decreased. As a result, the deterioration of an output waveform normally caused by a large input level is prevented. According to this method, when the diode D1 is turned on, a phase margin of the feedback circuit is decreased. Therefore, it is necessary to increase a collector current of the amplification stage transistor (Q10) in order to ensure a sufficient phase margin. This results in an increase of shot noise due to a base current, which leads to the deterioration of the receiving sensitivity.

Figure 2:
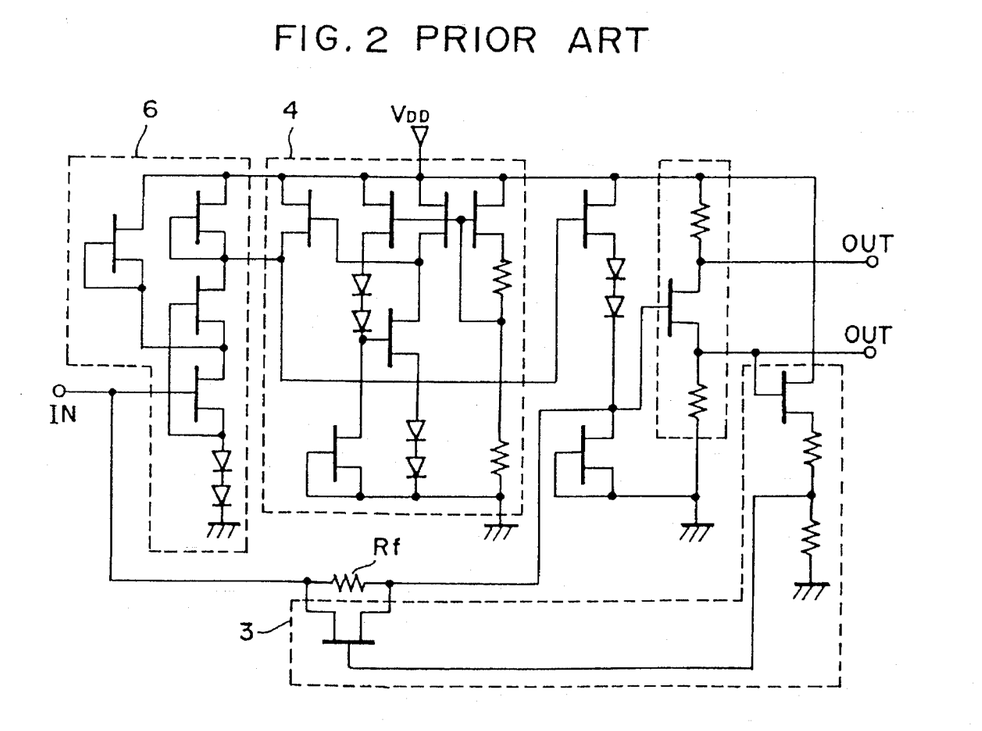
FIG. 2 is a block diagram showing a circuit configuration of another conventional transimpedance amplifier circuit.

In order to solve this problem, it is necessary to add a function wherein a gain of the amplification stage transistor Q20 is reduced while the diode D1 is being turned on, so that a sufficient phase margin can be ensured even when the diode D1 is turned on. Another transimpedance amplifier, which is provided with such function and fabricated with a GaAs-FET process, has already been realized. Such amplifier is disclosed in Technical Study Report CS92-10, pp. 61–68 published by the Institute of Electronics, Information and Communication Engineers of Japan. FIG. 2 shows a circuit configuration of this transimpedance amplifier. This transimpedance amplifier circuit comprises: an input signal amplifying section 6; a feedback resistor variable circuit 3 wherein an FET is connected in parallel to a feedback resistor Rf and a gate voltage of this FET is controlled by an output voltage of the amplifier circuit; and a load resistor variable circuit 4 which reduces a gain of the amplifying section 6 in accordance with the increase in the output voltage. In this circuit configuration, it is possible to reduce both the transimpedance and the gain of the amplification stage in response to an increase of the output voltage. Hence, the deterioration of an output waveform caused by a large input level can be prevented and, at the same time, a sufficient phase margin can be ensured.

However, in order to realize such a circuit in the form of an integrated circuit, it is necessary to use a GaAs-FET which has a low mass-producibility or a Si-MOSFET which suffers from significantly large variations in threshold voltages. Therefore, it is difficult to achieve good yield, which greatly increases costs.

SUMMARY OF THE INVENTION

In view of the foregoing observations, the primary object of the present invention is to provide a burst-signal applicable transimpedance amplifier circuit which can be manufactured using silicon bipolar devices less susceptible to variations in characteristics of devices, and which has superior resistance against power supply voltage variations and temperature variations, a wide dynamic range, high producibility and low noise characteristics.

According to an aspect of the present invention, there is provided a transimpedance amplifier circuit for converting an input current to an output voltage, the transimpedance amplifier circuit comprising:

an input terminal and an output terminal;

an amplifying transistor having a base connected to the input terminal, an emitter connected to a lower potential terminal through a level-shift circuit, and a collector connected to a higher potential terminal through a load resistor;

a feedback resistor connected between the input terminal and the output terminal;

a feedback resistor variable circuit connected in parallel to the feedback resistor, for varying an effective feedback resistance value of the feedback resistor when a level of an input signal inputted to the input terminal is larger than a predetermined level; and a load resistor variable circuit connected to the collector of the amplifying transistor, for varying an effective load resistance value of the amplifying transistor when a level of an input signal inputted to the input terminal is larger than a predetermined level.

When a current inputted to the transimpedance amplifier circuit is increased in proportion to an increase in the intensity of an optical input signal and then the diode connected in parallel to the feedback resistor is turned on, a current starts to flow through the diode. Hence, a parallel resistance value of the feedback resistor and the resistor (whose resistance value is smaller than a resistance value of the feedback resistor) connected in series to the diode serves as an effective feedback resistance value and, therefore, transimpedance is decreased. Almost instantaneously, the diode connected between a collector of the amplifying stage transistor and the reference voltage source (whose electric potential substantially equals a collector potential of the amplifying stage transistor when an input current is zero) is turned on. As a result, a load resistance value is decreased while a collector bias current of the amplifying stage transistor is kept constant, and a gain of the amplifying stage transistor is also decreased. Hence, a decrease in phase margin of a feedback circuit can be prevented. Thus, it is possible to sufficiently reduce a collector current of the amplification stage transistor, and also it is possible to ensure a low noise characteristic which is substantially the same as is obtained when the diode is not connected in parallel to the feedback resistor. Since this transimpedance amplifier circuit amplifies an input signal in a logarithmic manner, it is possible for the transimpedance amplifier circuit to operate in a bit-by-bit manner. The feedback resistor variable circuit and the load resistor variable circuit operate in reference to a diode voltage of the P-N junction diode, and hence the transimpedance amplifier circuit is less susceptible to the influence of variations in characteristics of devices. Since respective elements of this transimpedance amplifier circuit can be manufactured by the use of Si-Bipolar process, this amplifier circuit is superior in mass-producibility. Moreover, it is easy to equalize the following-characteristics of the collector potential of the common emitter circuit and the potential of the reference voltage supply source at the time when the input current is zero, and therefore superior power supply and temperature variation resistance characteristics will be obtained.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the present invention will be described, in which a transimpedance amplifier circuit is used as a front end processor of a digital optical receiving circuit, and a current flows into the transimpedance amplifier circuit at a "mark" of a digital signal and the current does not flow at a "space" of the digital signal.

Figure 3:
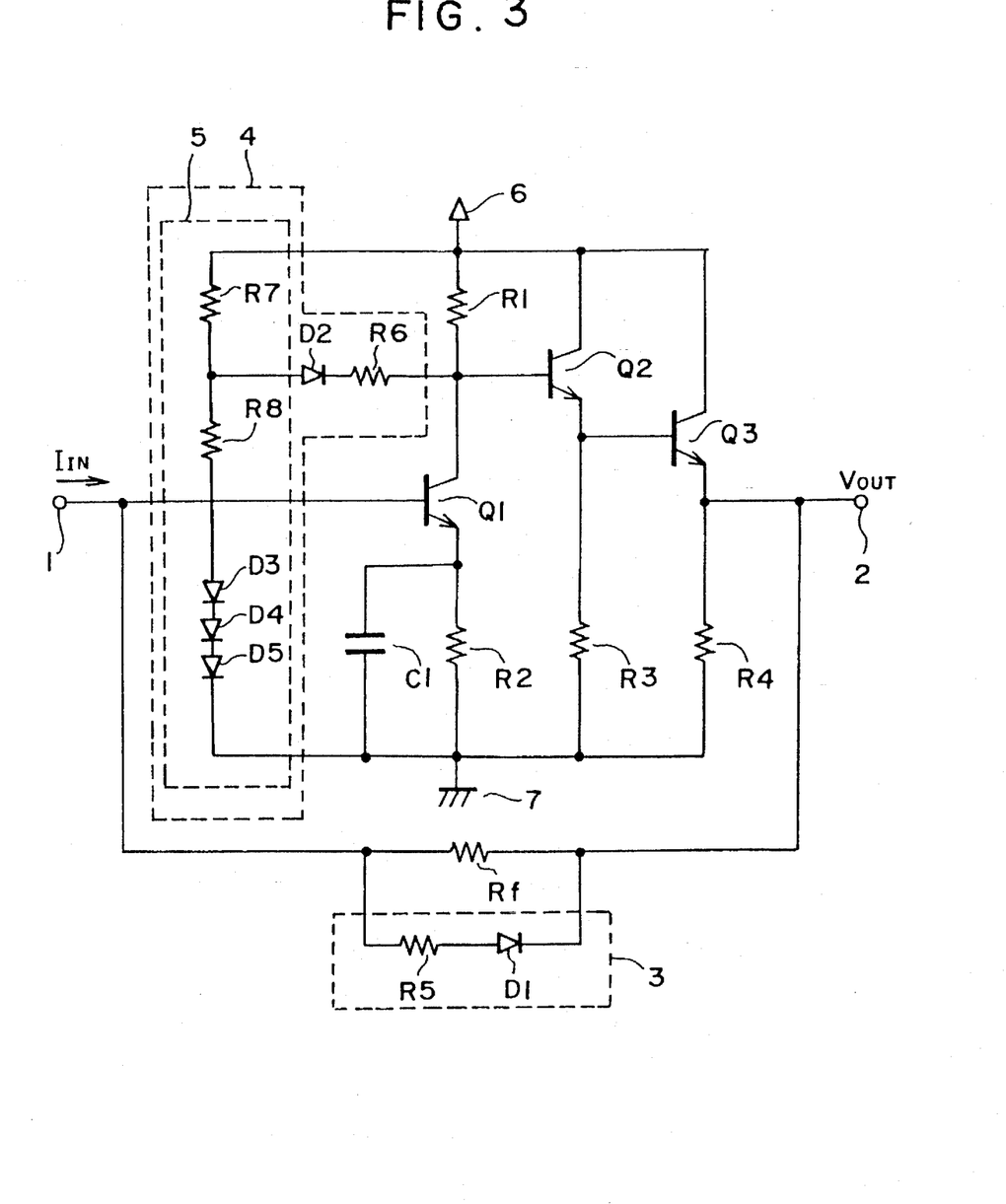
FIG. 3 is a block diagram showing a circuit configuration of a transimpedance amplifier circuit according to a first embodiment of the present invention.

A first embodiment of the present invention will now be described. FIG. 3 shows a circuit configuration of a transimpedance amplifier circuit according to the first embodiment of the present invention. The transimpedance amplifier circuit comprises: a circuit consisting of three transistors Q1–Q3, resistors R1–R4, and a capacitor C1; a feedback resistor Rf connected between an input terminal 1 and an output terminal 2; a feedback resistor variable circuit 3; and a load resistor variable circuit 4 connected to a collector of the first stage transistor Q1. The feedback resistor variable circuit 3 connected in parallel to the feedback resistor Rf is formed by a diode D1 and a resistor R5 connected in series. In the first embodiment shown in FIG. 3, the polarity of an input current $I_{IN}$ at the input terminal 1 is oriented to the direction wherein the current flows into the transimpedance amplifier circuit, and hence an anode and a cathode of the diode D1 are coupled to the input terminal 1 and the output terminal 2, respectively. The load resistor variable circuit 4 is formed by a reference voltage source 5, and a diode 2 and a resistor R6 which are connected in series between the reference voltage source 5 and the collector of the transistor Q1. In this embodiment shown in FIG. 3, a collector potential of the transistor Q1 is lowered with respect to the output potential of the reference voltage source 5 in accordance with an increase in the input current $I_{IN}$. Hence, an anode and a cathode of the diode D2 are coupled to the reference voltage source 5 and the collector of the transistor Q1, respectively. Resistors R7 and R8, and diodes D3–D5 are connected in series between a power supply terminal 6 and a ground terminal 7. A connection node between the resistors R7 and R8 is used as an output terminal of the reference voltage source 5, and an electric potential of the reference voltage source 5 is set to a value which essentially equals the collector potential of the transistor Q1 at the time when the input current $I_{IN}$ is zero.

When the intensity of an optical input signal is small, the current $I_{IN}$ inputted to the transimpedance amplifier circuit is also small. Therefore, the diodes D1 and D2 are both in an off state, and the transimpedance amplifier circuit conducts the normal operation accordingly. However, when the current $I_{IN}$ inputted to the transimpedance amplifier circuit increases in proportion to an increase in the intensity of the optical input signal, the diode D1 is turned on, and a current starts to flow into the diode D1. As a result, a parallel resistance value of the resistor R5 connected to the diode D1, and the feedback resistor Rf becomes an effective feedback resistance value, whereby a transimpedance is decreased. Almost instantaneously, the diode D2 is turned on, and the load resistance value is decreased while a collector bias current of the amplification stage transistor Q1 is being kept constant. A gain of the transistor Q1 is also decreased, and hence it is possible to prevent a phase margin of the feedback circuit from being decreased. Therefore, a collector current of the amplifying stage transistor Q1 can be made sufficiently small, and it is possible to ensure a low noise characteristic the same as in the case where the diode D1 is not connected in parallel to the feedback resistor Rf. In this transimpedance amplifier circuit of this embodiment, the control of a gain of an output relative to an input is not carried out by a feedback loop, but an input signal is amplified in a logarithmic manner and then outputted. Hence, the transimpedance amplifier circuit can operate in the bit-by-bit manner.

Figure 4:
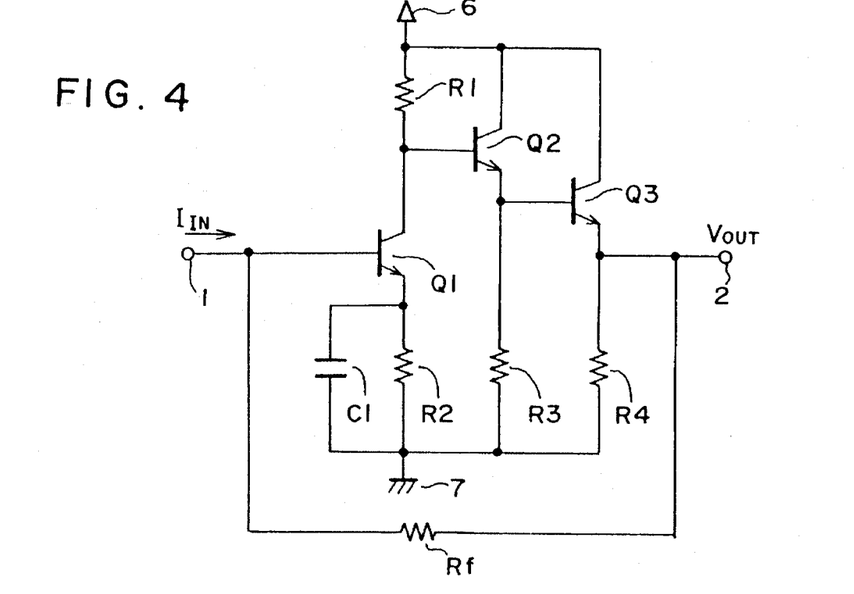
FIG. 4 is a block diagram showing a circuit configuration of a transimpedance amplifier circuit wherein a feedback resistor variable circuit and a load resistor variable circuit have been removed from the circuit shown in FIG. 3.
Figure 5:
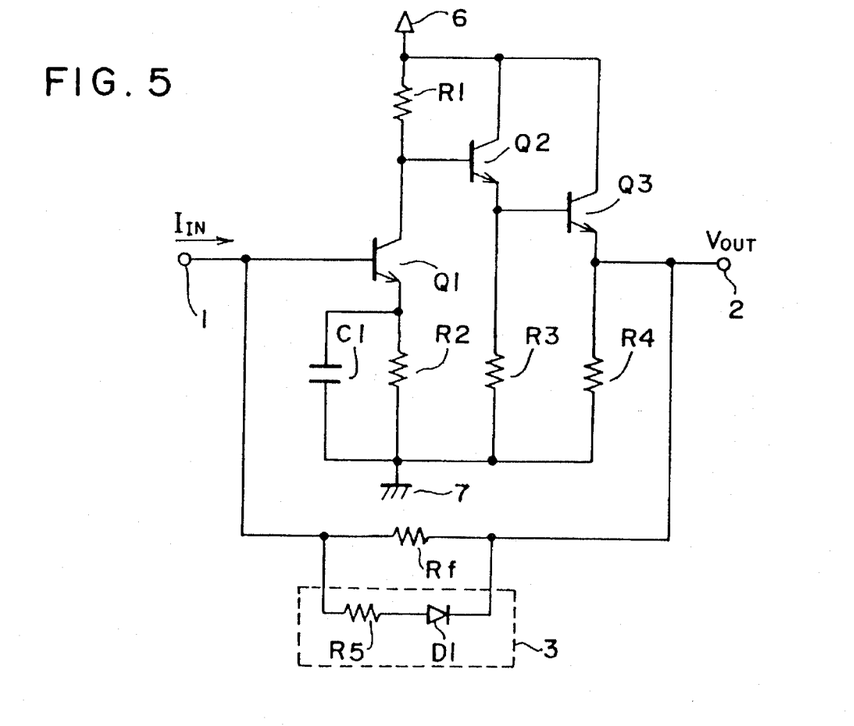
FIG. 5 is a block diagram showing a circuit configuration of a transimpedance amplifier circuit wherein the load resistor variable circuit has solely been removed from the circuit shown in FIG. 3.

Results obtained when circuit simulation has been performed for the following three types of circuits will be explained hereinbelow. FIG. 4 shows a first transimpedance amplifier circuit (1) in which the feedback resistor variable circuit 3 and the load resistor variable circuit 4 have been removed from the transimpedance amplifier circuit shown in FIG. 3. FIG. 5 shows a second transimpedance amplifier circuit (2) in which only the load resistor variable circuit 4 has been removed from the transimpedance amplifier circuit shown in FIG. 3. A third transimpedance amplifier circuit (3) is the same as that of the first embodiment shown in FIG. 3 in which both the feedback resistor variable circuit 3 and the load resistor variable circuit 4 are provided. In the simulation, it is assumed that a current source having a parasitic capacitance of 1 pF is connected to the input terminal 1 and device parameters of the transistors Q1–Q3 of these circuits are set to representative values of a Si-Bipolar transistor.

Figure 6:
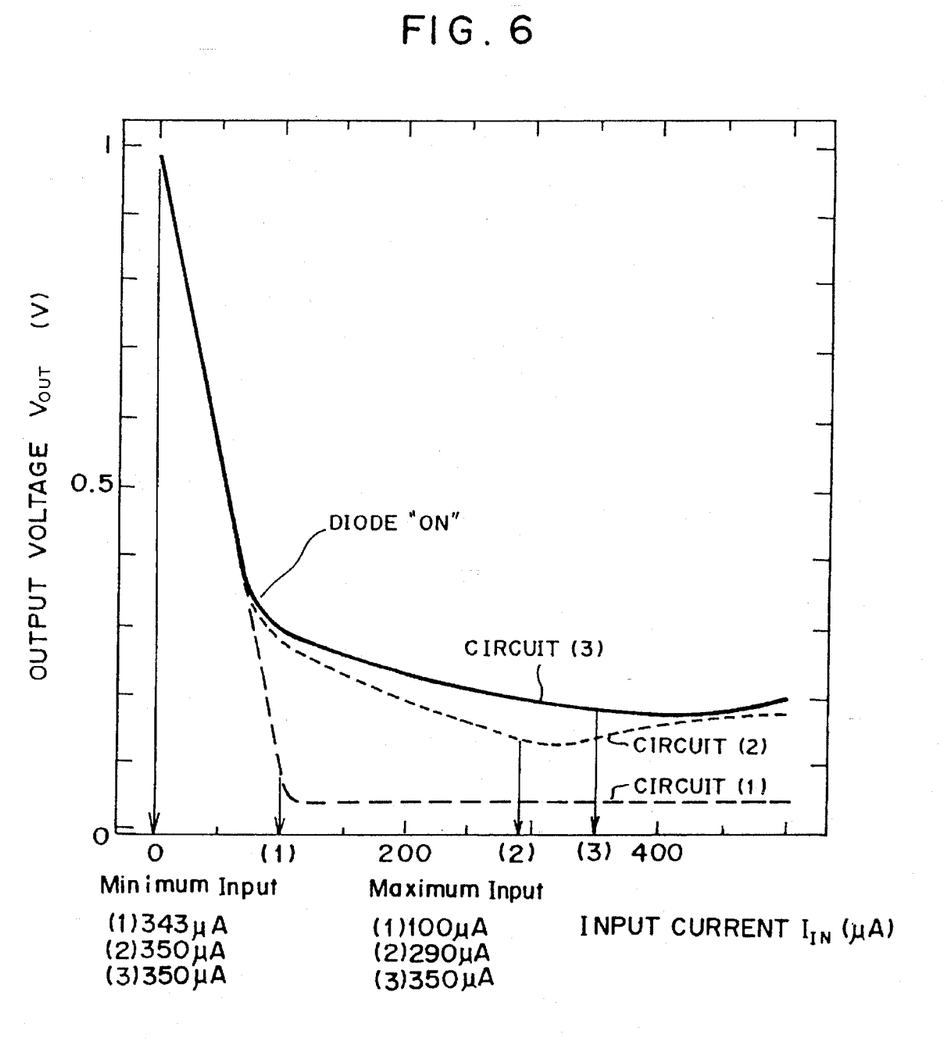
FIG. 6 is a graph showing a relationship between an input current and an output voltage obtained by the transimpedance amplifier circuit of the first embodiment shown in FIG. 3, the transimpedance amplifier circuit shown in FIG. 4 without the feedback resistor variable circuit and the load resistor variable circuit, and the transimpedance amplifier circuit shown in FIG. 5 without the load resistor variable circuit.
Figure 7A:
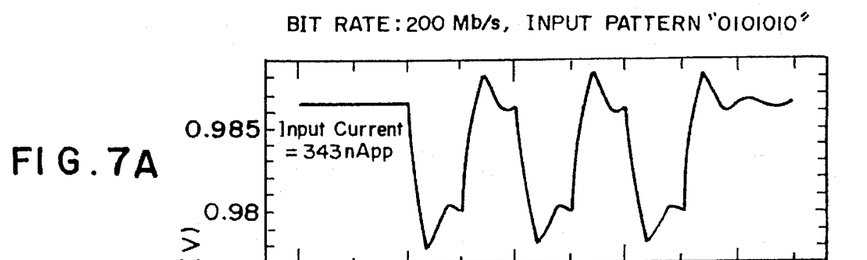
FIG. 7 shows output voltage waveforms obtained when an input current having a signal waveform shown in FIG. 8 at three input levels is applied to the transimpedance amplifier circuit shown in FIG. 4 without the feedback resistor variable circuit and the load resistor variable circuit.
Figure 7B:
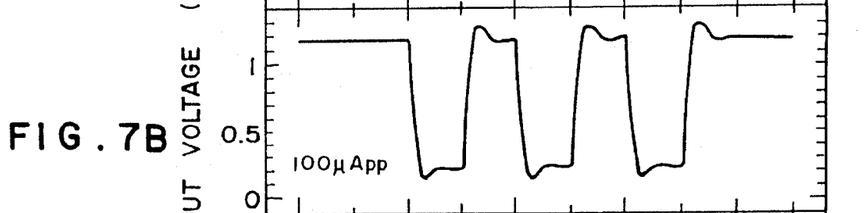
Figure 7C:
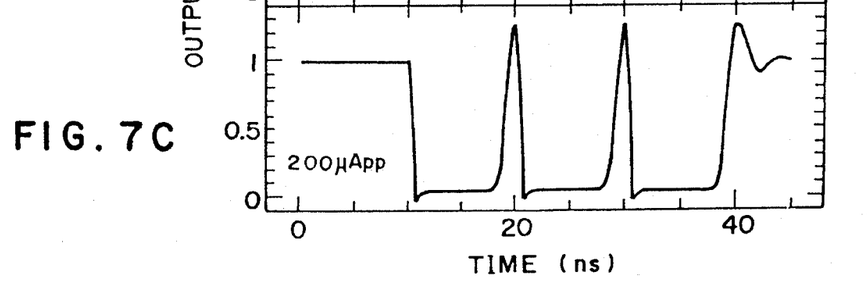
Figure 8:
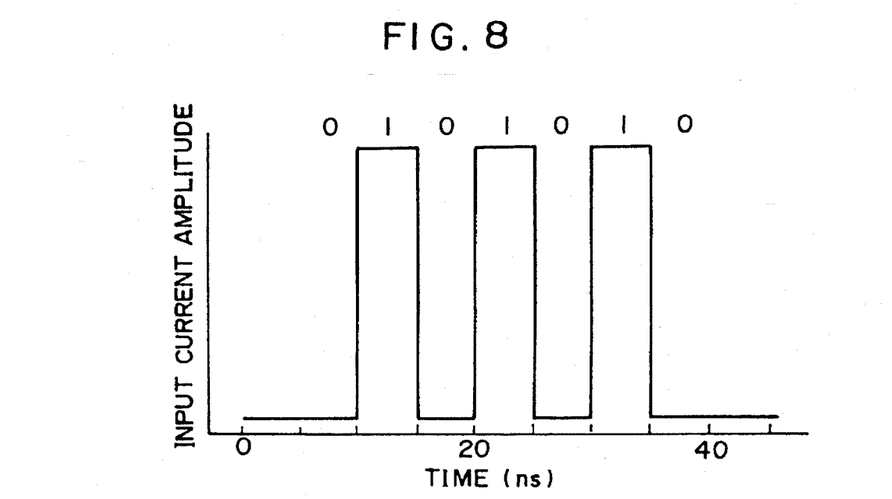
FIG. 8 is a schematic representation of a waveform of an input current signal.
Figure 9A:
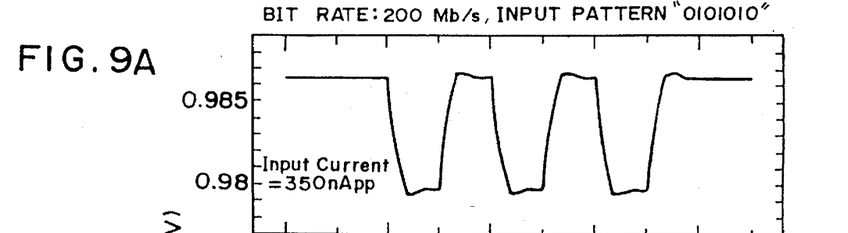
FIG. 9 shows output voltage waveforms obtained when an input current having a signal waveform shown in FIG. 8 at three input levels is applied to the transimpedance amplifier circuit shown in FIG. 5 without the load resistor variable circuit.
Figure 9B:
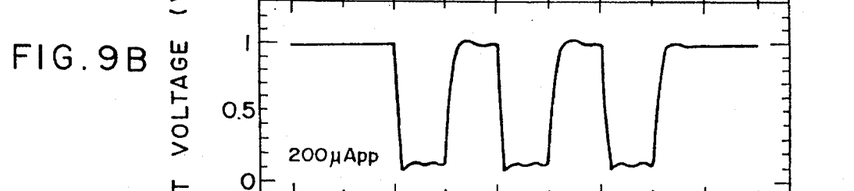
Figure 9C:
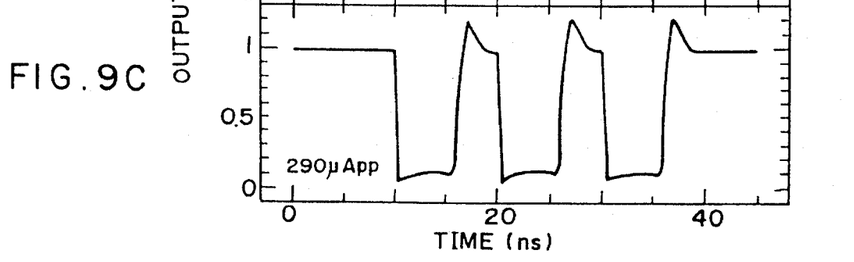
Figure 10A:
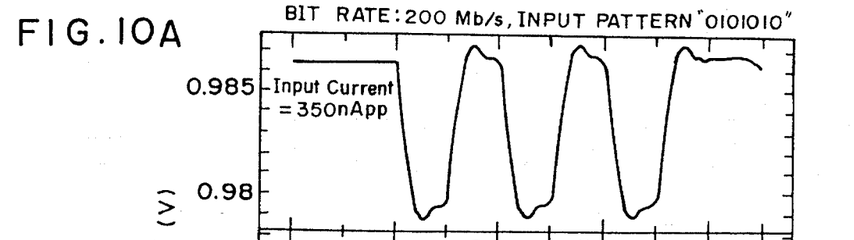
FIG. 10 shows output voltage waveforms obtained when an input current having a signal waveform shown in FIG. 8 at three input levels is applied to the transimpedance amplifier circuit of the first embodiment shown in FIG. 3.
Figure 10B:
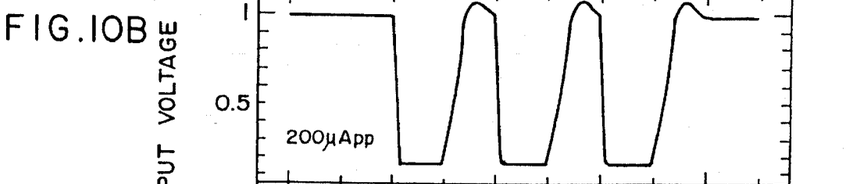
Figure 10C:
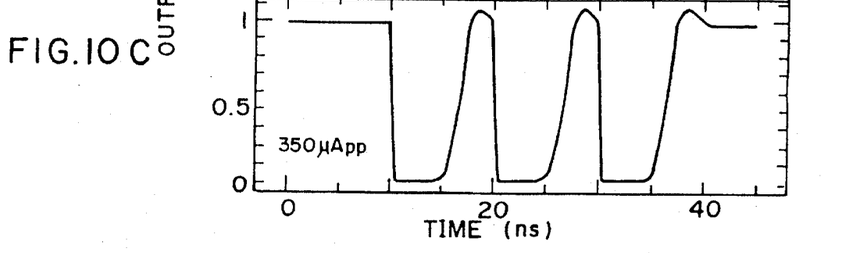

FIG. 6 shows results of computation of variations in the output voltage $V_{OUT}$ with respect to the input current $I_{IN}$. Inclinations of graphs represent a transimpedance. In the case of the first circuit (1) shown in FIG. 4 without the feedback resistor variable circuit 3 and the load resistor variable circuit 4, a transimpedance becomes saturated above a certain input current, and a maximum allowable input current value is limited at that point. FIG. 7 shows signal waveforms of an output voltage $V_{OUT}$ obtained when an input current having a signal waveform (an input pattern "0101010") shown in FIG. 8 at a signal rate of 200 Mb/s is applied to the first transimpedance amplifier circuit (1) shown in FIG. 4. As can be seen, output voltage waveforms are deteriorated in the case where the input level exceeds the maximum allowable input current (100 µA). However, as can be seen from FIG. 6, in the second and third circuits (2) and (3) each having the feedback resistor variable circuit, the inclinations of the graphs become gentle after the diode D1 has been turned on, and a transimpedance is decreased. The graphs show the fact that the feedback resistor variable circuit 3 is effectively operating. FIG. 9 shows signal waveforms of an output voltage $V_{OUT}$ obtained when an input current having the waveform shown in FIG. 8 at three input levels is applied to the second circuit (2) shown in FIG. 5, and FIG. 10 shows signal waveforms of an output voltage $V_{OUT}$ obtained when an input current having the waveform shown in FIG. 8 is applied to the third circuit (3) shown in FIG. 3. As can be seen from the foregoing results, the addition of the feedback resistor variable circuit 3 to the transimpedance amplifier circuit resulted in an increased maximum allowable input current value and, hence, an increased input dynamic range. At the same time, an output dynamic range was compressed.

Figure 11:
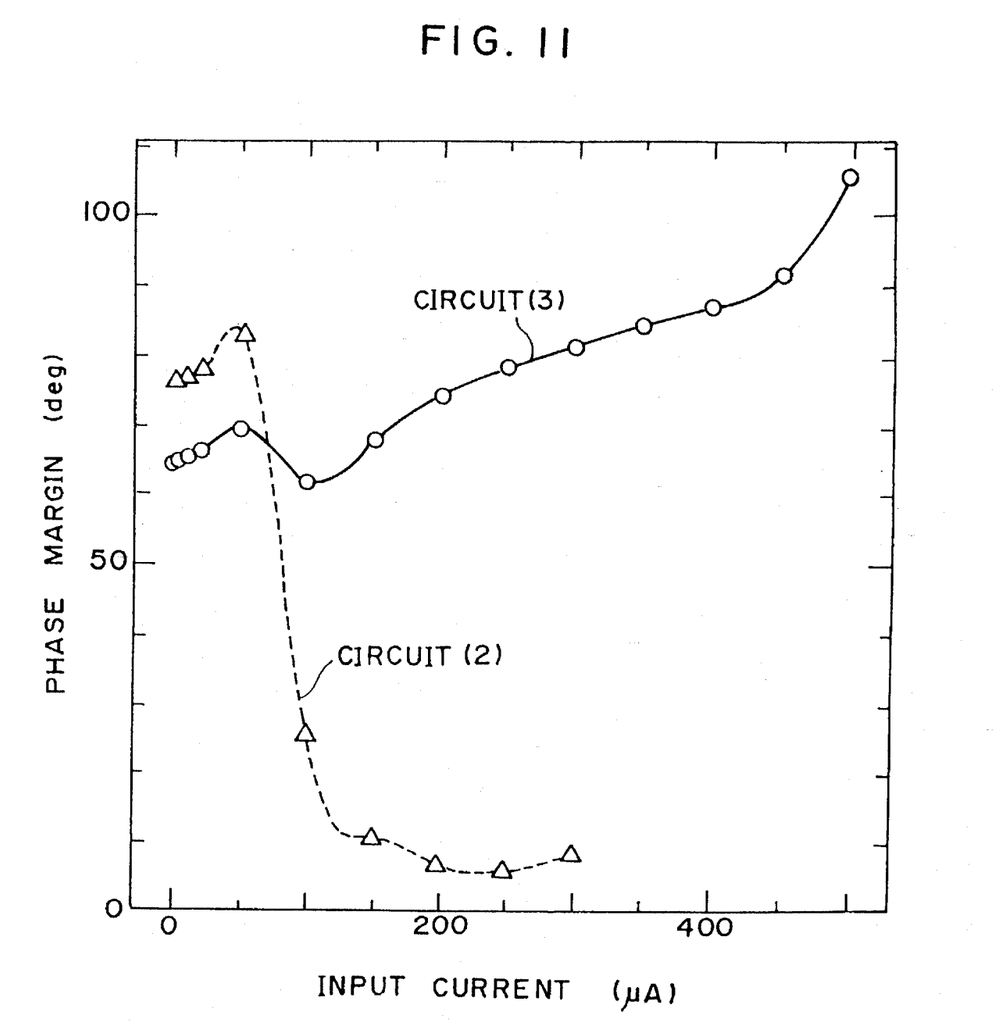
FIG. 11 is a graph showing a relationship between an input current and a phase margin obtained by the transimpedance amplifier circuit of the first embodiment shown in FIG. 3 and the transimpedance amplifier circuit shown in FIG. 5 without the load resistor variable circuit.
Figure 12:
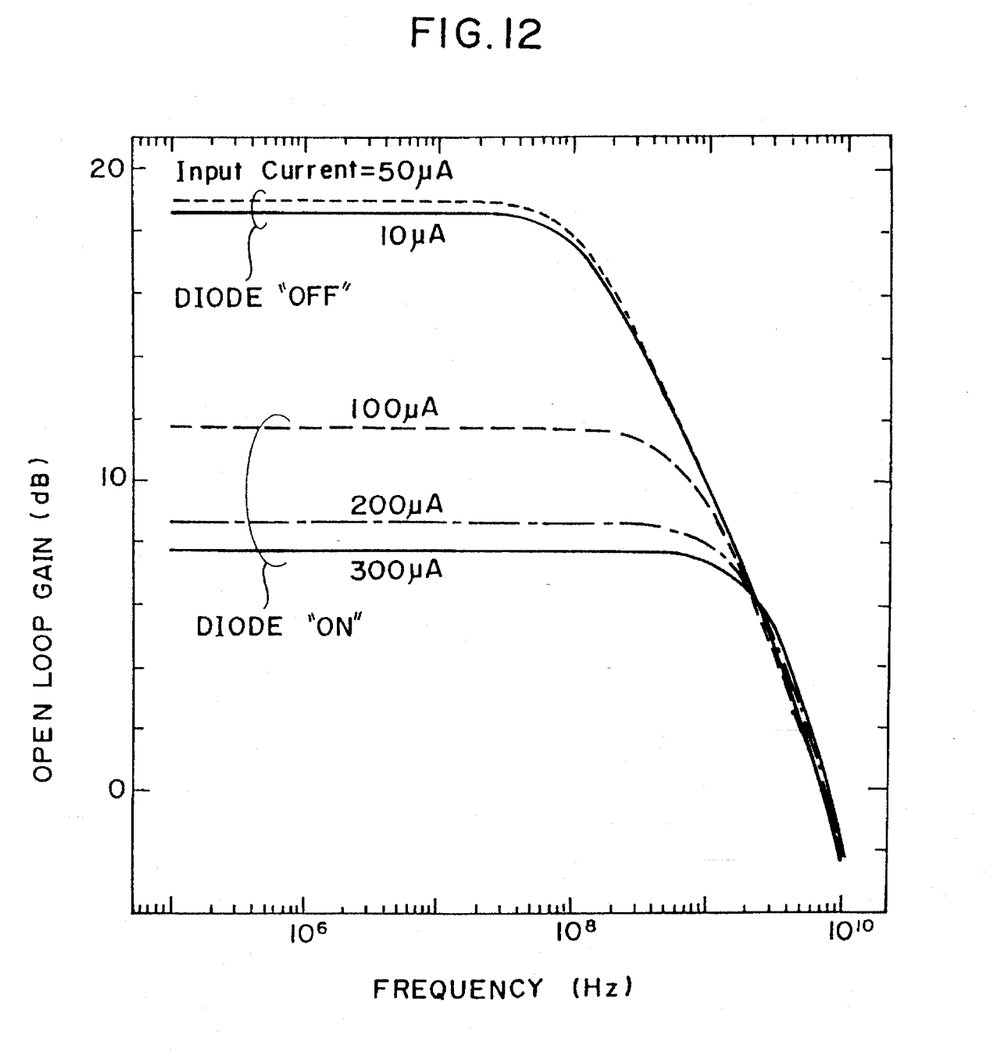
FIG. 12 is a graph showing a relationship of frequency responses of input currents at different input levels and a non-feedback (open loop) gain in the transimpedance amplifier circuit of the first embodiment shown in FIG. 3.

FIG. 11 shows computational results showing a relationship between an input current and a phase margin obtained by the second transimpedance circuit (2) not having the load resistor variable circuit shown in FIG. 5 and the third transimpedance circuit (3) having the load resistor variable circuit shown in FIG. 3. FIG. 12 shows computational results of non-feedback (open loop) gain vs. frequency characteristics obtained when the input current inputted to the circuit shown in FIG. 3 was changed. After the diode D2 has been turned on, a load resistance is decreased in accordance with an increase of the input current, and hence a non-feedback gain (open loop gain) is also decreased. A phase margin of more than 60° is kept, and FIGS. 11 and 12 show the fact that the load resistor variable circuit 4 is effectively operating.

The following Table 1 shows computational results of an equivalent input noise current density (for example, a value at frequencies of 1 MHz and 156 MHz), an RMS noise current (an RMS value in the range of frequencies 0–156 MHz of the equivalent input noise current density), and an input/output dynamic range, of the respective circuits (1)–(3). The minimum input current amplitude at the calculation of an input/output dynamic range is specified to twelve times the RMS noise current.

TABLE 1

| CIRCUIT No. | (1) | (2) | (3) |
|---|---|---|---|
| Equivalent Input Noise Current Density | | | |
| 1 MHz | 1.6pA/√Hz | 1.6pA/√Hz | 1.6pA/√Hz |
| 156 MHz | 3.3pA/√Hz | 43.4pA/√Hz | 3.4pA/√Hz |
| RMS Noise Current | 28.6nA | 29.2nA | 29.2nA |
| Input Dynamic Range | 49.3dB | 58.4dB | 60.0dB |
| Minimum Input Current Amplitude | 343nA$_{pp}$ | 350nA$_{pp}$ | 350nA$_{pp}$ |
| Maximum Input Current Amplitude | 100μA$_{pp}$ | 290μA$_{pp}$ | 350μA$_{pp}$ |
| Output Dynamic Range | 49.3dB | 48.6dB | 48.1dB |
| Minimum Output Voltage Amplitude | 3.09mV$_{pp}$ | 3.15mV$_{pp}$ | 3.15mV$_{pp}$ |
| Maximum Output Voltage Amplitude | 896mV$_{pp}$ | 851mV$_{pp}$ | 804mV$_{pp}$ |

In Table 1, when the circuit (2) shown in FIG. 5 and the circuit (3) shown in FIG. 3 are compared with each other, RMS noise currents of both the circuits are 29.2 nA. However, as can be seen from the results shown in FIG. 11, the phase margin of the circuit (3) shown in FIG. 3 is not decreased after the diode D2 is turned on. A sufficient phase margin can be ensured while low noise characteristics are maintained by means of the load resistor variable circuit 4.

When the circuit (1) shown in FIG. 4 and the circuit (3) shown in FIG. 3 are compared with each other, an input dynamic range is improved from 49.3 dB to 60.0 dB, and an output dynamic range is improved from 49.2 dB to 48.1 dB. Thus, both the increase of the input dynamic ranges and the compression of the output dynamic ranges were realized.

Figure 13:
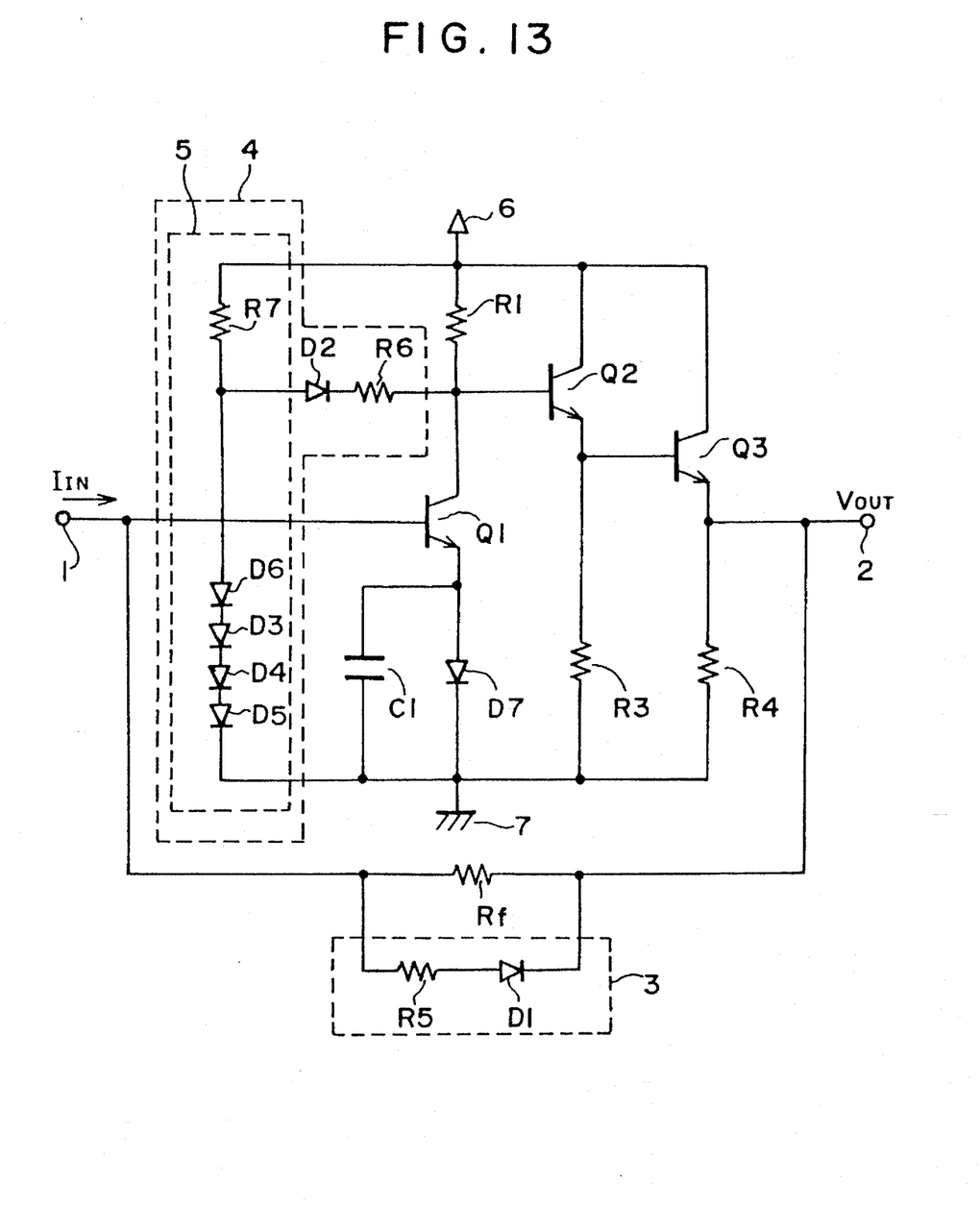
FIG. 13 is a block diagram showing a transimpedance amplifier circuit according to a second embodiment of the present invention.

A transimpedance amplifier circuit according to a second embodiment of the present invention will now be described. The same reference numerals are provided to designate corresponding elements of the first embodiment, and the explanation thereof will be omitted here for brevity. In the second embodiment, as shown in FIG. 13, a diode D7 functioning as a level-shift circuit is connected between the emitter of the amplifying stage transistor Q1 and the ground terminal 7 with an anode thereof being connected to the emitter of the transistor Q1 and with a cathode thereof being connected to the ground terminal 7. In this embodiment, the resistor R8 of the reference voltage source 5 shown in FIG. 3 is replaced with a diode D6. The following Table 2 shows computational results of an equivalent input noise current density, an RMS noise current and input/output dynamic ranges of the transimpedance amplifier circuit of this embodiment.

TABLE 2

| Equivalent Input Noise Current Density | |
|---|---|
| 1 MHz | 1.5pA/√Hz |
| 156 MHz | 3.5pA/√Hz |
| RMS Noise Current | 29.4nA |
| Input Dynamic Range | 67.8dB |
| Minimum Input Current Amplitude | 353nA$_{pp}$ |
| Maximum Input Current Amplitude | 870μA$_{pp}$ |

TABLE 2-continued

| | |
|---|---|
| Output Dynamic Range | 51.2dB |
| Minimum Output Voltage Amplitude | 3.36mV$_{pp}$ |
| Maximum Output Voltage Amplitude | 1.22V$_{pp}$ |

Figure 14:
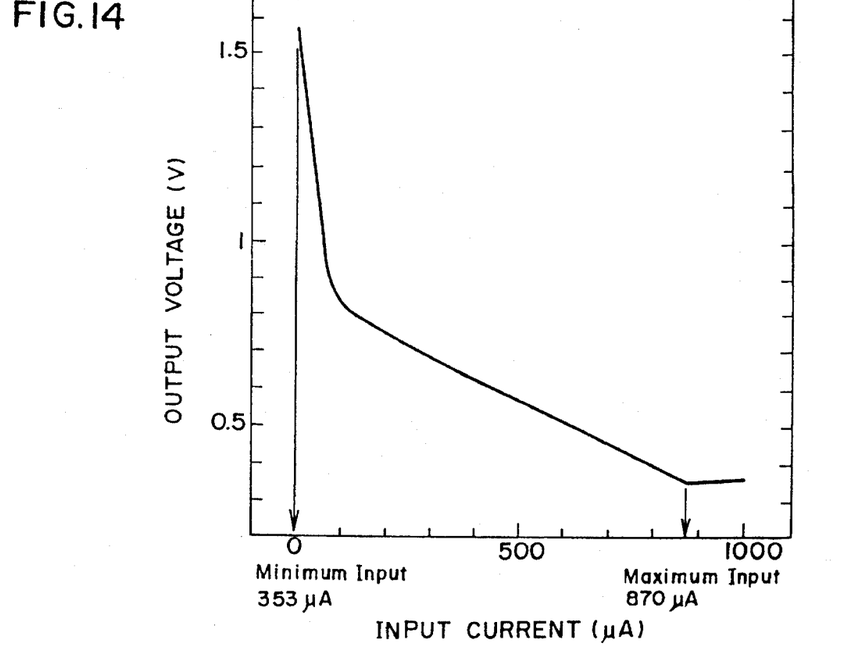
FIG. 14 is a graph showing a relationship between an input current and an output voltage in the transimpedance amplifier circuit of the second embodiment shown in FIG. 13.
Figure 15A:
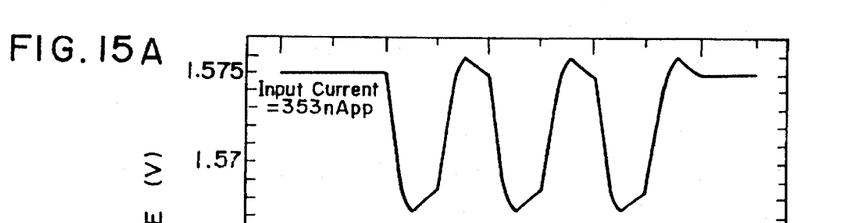
FIG. 15 shows output voltage waveforms obtained when an input current having a signal waveform shown in FIG. 8 at three input levels is applied to the transimpedance amplifier circuit of the second embodiment shown in FIG. 13.
Figure 15B:
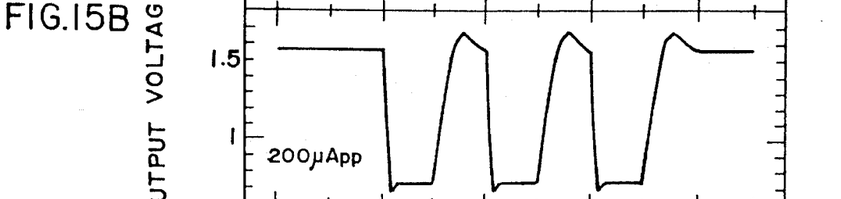
Figure 15C:
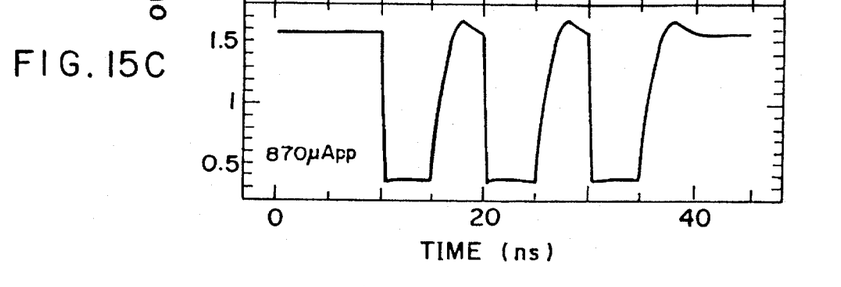

FIG. 14 shows computational results of variations in the output voltage $V_{OUT}$ relative to the variations of the input current $I_{IN}$, whereas FIG. 15 shows voltage waveforms of the output $V_{OUT}$ obtained when an input current having the signal waveform shown in FIG. 8 at three input levels is applied to the transimpedance amplifier circuit shown in FIG. 13. The input dynamic range is 67.8 dB, and the output dynamic range is 51.2 dB. The compression ratio of the output dynamic range is less when compared to that of the transimpedance amplifier circuit (3) shown in FIG. 3. However, the input dynamic range is enhanced by 19.7 dB.

Figure 16:
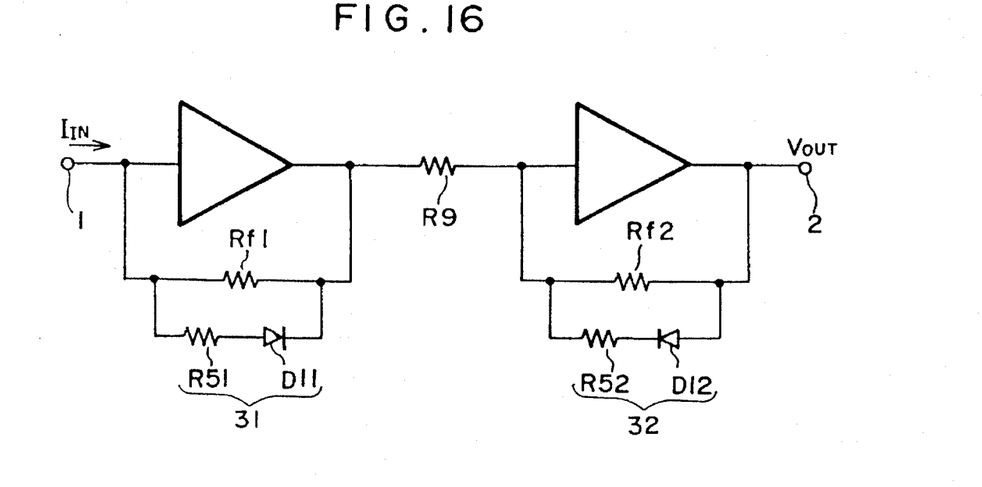
FIG. 16 is a block diagram showing a transimpedance amplifier circuit according to a third embodiment of the present invention.

A transimpedance amplifier circuit according to a third embodiment of the present invention will now be described. FIG. 16 is a block diagram showing the configuration of the transimpedance amplifier circuit of this embodiment.

In this embodiment, the transimpedance amplifier circuits of the second embodiment are connected into two stages in cascade with resistor R9 which functions as a voltage-current converting circuit being interposed therebetween. A transimpedance amplifier circuit on the first stage is provided with a feedback resistor Rf1 and a feedback resistor variable circuit 31 which is connected in parallel to the feedback resistor Rf1. This feedback resistor variable circuit 31 is composed of a diode D11 and a resistor 51 which are connected in series with each other. A resistance value of the resistor 51 is smaller than that of the feedback resistor Rf1. A transimpedance amplifier circuit on the second stage is provided with a feedback resistor Rf2 and a feedback resistor variable circuit 32 which is connected in parallel to the feedback resistor Rf2. The feedback resistor variable circuit 32 is composed of a diode D12 and a resistor 52 connected in series. A resistance value of the resistor 52 is smaller than that of the feedback resistor Rf2. The polarity of an input current at the transimpedance amplifier circuit on the second stage is opposite to that of an input current at the transimpedance amplifier circuit on the first stage, and hence the polarity of the diode D12 of the feedback resistor variable circuit 32 on the second stage is so set to be opposite to that of the diode D11 of the feedback resistor variable circuit 31 on the first stage. In this circuit configuration, the transimpedance amplifier circuits are connected into two stages. Therefore, the input dynamic range is increased, but the output dynamic range is compressed when compared with those of the transimpedance amplifier circuit (1) shown in FIGS. 3 or 13. The following Table 3 shows computational results of an equivalent input noise current density, an RMS noise current, and input and output dynamic ranges of the two-stage transimpedance amplifier circuit of this embodiment.

TABLE 3

| Equivalent Input Noise Current Density | |
|---|---|
| 1 MHz | 2.4pA/√Hz |
| 156 MHz | 3.9pA/√Hz |
| RMS Noise Current | 37.1nA |
| Input Dynamic Range | 65.1dB |
| Minimum Input | 445nA$_{pp}$ |

TABLE 3-continued

| | |
|---|---|
| Current Amplitude | |
| Maximum Input Current Amplitude | 800μA$_{pp}$ |
| Output Dynamic Range | 45.4dB |
| Minimum Output Voltage Amplitude | 3.91mV$_{pp}$ |
| Maximum Output Voltage Amplitude | 727mV$_{pp}$ |

Figure 17:
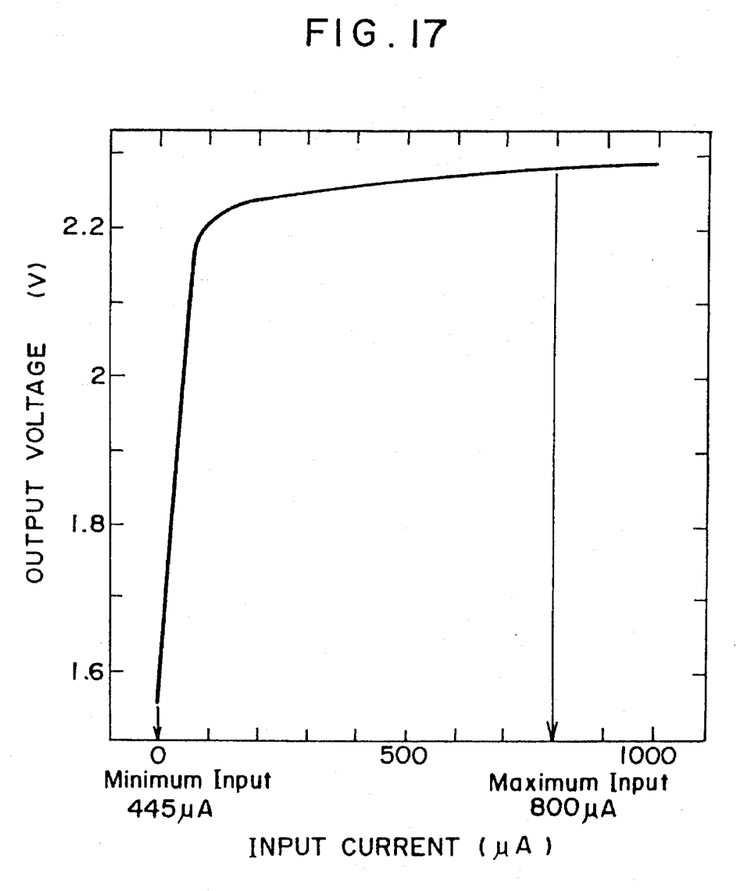
FIG. 17 is a graph showing a relationship between an input current and an output voltage in the transimpedance amplifier circuit of the third embodiment shown in FIG. 16.
Figure 18A:
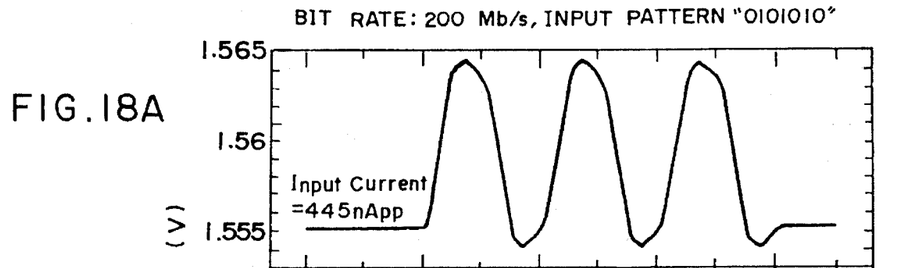
FIG. 18 shows output voltage waveforms obtained when an input current having a signal waveform shown in FIG. 8 at three input levels is applied to the transimpedance amplifier circuit of the third embodiment shown in FIG. 16.
Figure 18B:
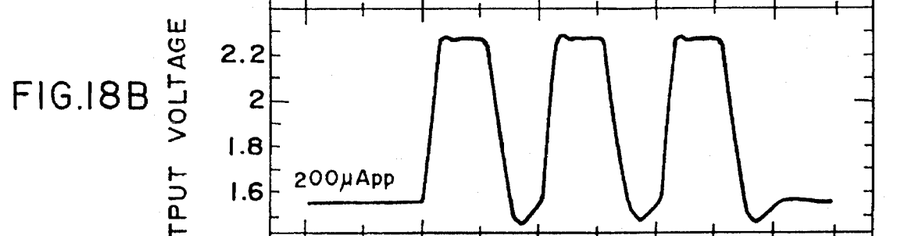
Figure 18C:
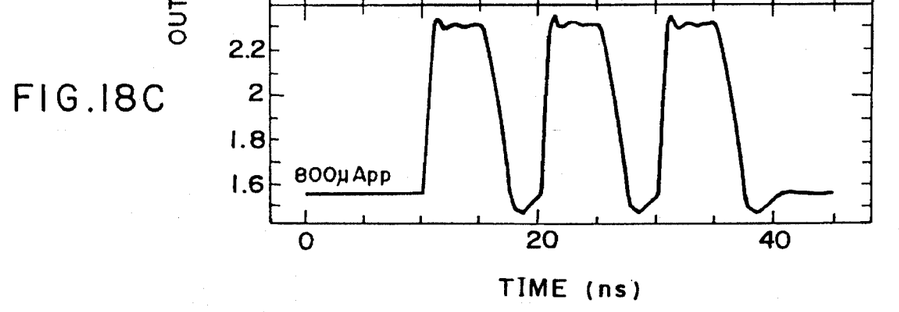

FIG. 17 shows results of computation of variations in an output voltage $V_{OUT}$ with respect to an input current $I_{IN}$, whereas FIG. 18 shows voltage waveforms of the output voltage $V_{OUT}$ when an input current having the signal waveform shown in FIG. 8 at three input levels is applied to the transimpedance amplifier circuit of this embodiment. The equivalent input noise current density became slightly large when compared with that obtained by the transimpedance amplifier circuit shown in FIGS. 3 or 13. The input dynamic range is increased to 29.5 dB, but the output dynamic range is compressed to 19.7 dB.

Figure 19:
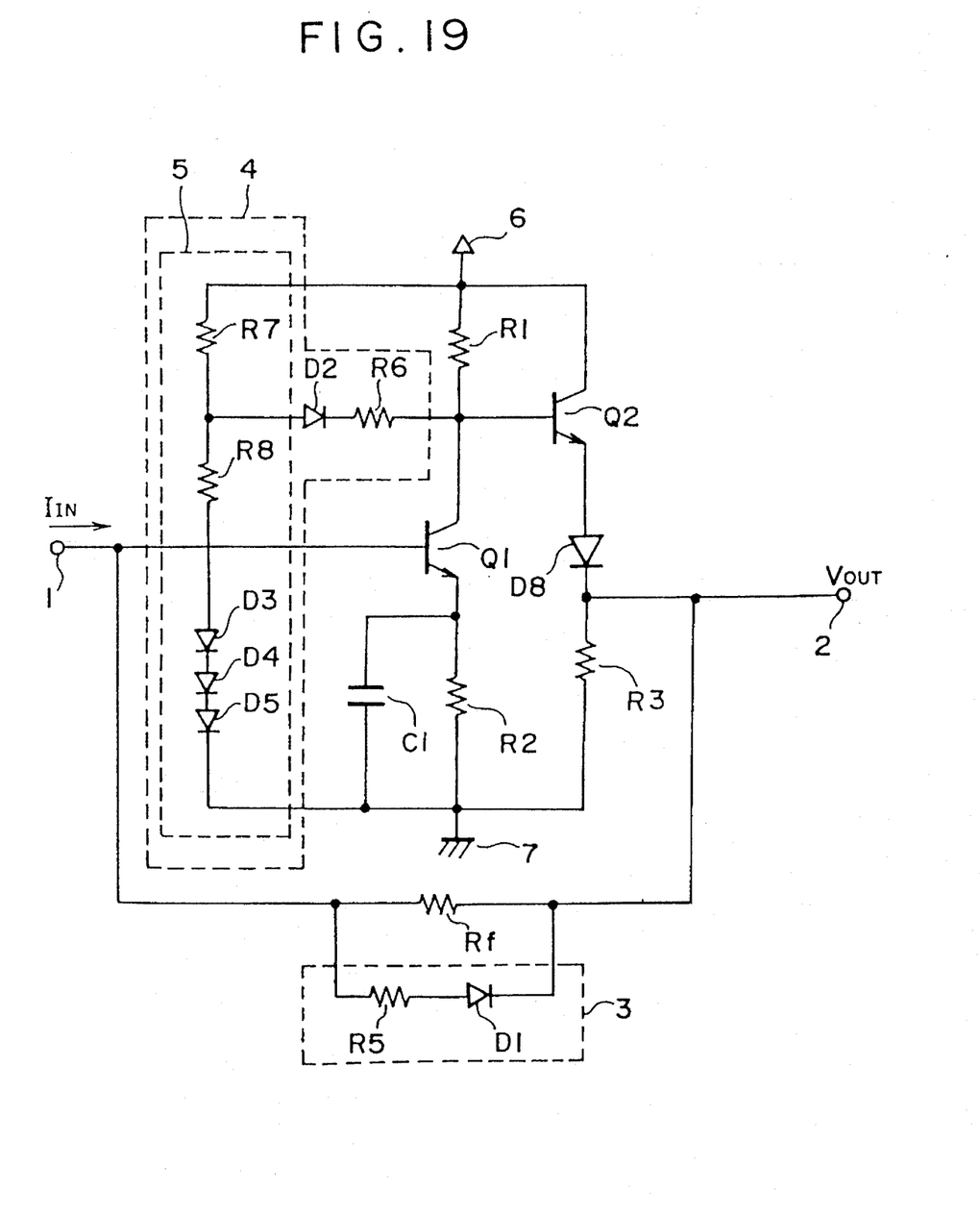
FIG. 19 is a block diagram showing a modified transimpedance amplifier circuit wherein an output stage is modified from the circuit shown in FIG. 3.

In the above embodiments, the polarity of the input current $I_{IN}$ at the input terminal 1 is only oriented to the direction in which a current flows into the amplifier circuit. However, in the case of the opposite polarity of the input current, the two-stage transimpedance amplifier circuit of this embodiment can cope with such a situation by reversing the polarities of the diodes D1(D11) and D2(D12). Moreover, in the above embodiments, the Darlington paired transistors Q2 and Q3 are used as an amplifier at an output level shift stage of the transimpedance amplifier circuit, but a level shift circuit without the use of the transistor Q3 and the resistor R4 may be used instead of the Darlington pair in which the emitter of the transistor Q2 is connected to the ground terminal 7 through a diode D8 and a resistor R3 as shown in FIG. 19.

As described above, the present invention is directed to the transimpedance amplifier circuit that operates in a bit-by-bit, in which P-N junction diodes are used in the feedback resistor variable circuit and the load resistor variable circuit. According to this transimpedance amplifier circuit, it is possible to obtain an increased input dynamic range, and also possible to ensure a sufficient phase margin while low noise characteristics are maintained. In addition, the transimpedance amplifier circuit is less susceptible to the influence of variations in characteristics of devices, and also has superior mass-producibility and superior supply voltage and temperature variation resistance.

Several embodiments of the invention have now been described in detail. It is to be noted, however, that these descriptions of specific embodiments are merely illustrative of the principles underlying the inventive concept. It is contemplated that various modifications of the disclosed embodiment, as well as other embodiments of the invention will, without departing from the spirit and scope of the invention, be apparent to persons skilled in the art.

What is claimed is:

1. A transimpedance amplifier circuit for converting an input current to an output voltage, said transimpedance amplifier circuit comprising:

an input terminal and an output terminal;

an amplifying transistor having a base connected to said input terminal, an emitter connected to a lower potential terminal through a level shift circuit, and a collector connected to a higher potential terminal through a load resistor;

a feedback resistor connected between said input terminal and said output terminal;

a feedback resistor variable circuit connected in parallel to said feedback resistor, for varying an effective feedback resistance value of said feedback resistor when a level of an input signal inputted to said input terminal is larger than a predetermined level; and a load resistor variable circuit connected to the collector of said amplifying transistor, for varying an effective load resistance value of said amplifying transistor when a level of an input signal inputted to said input terminal is larger than a predetermined level, said load resistor variable circuit including a reference voltage source for outputting at an output node thereof an output potential which substantially equals a collector potential of said amplifying transistor when an input current at said input terminal is zero or very small, and a series circuit of a P-N junction diode and a resistor connected between said output node of said reference voltage source and the collector of said amplifying transistor, a resistance value of said resistor being smaller than that of said load resistor and said P-N junction diode being connected such that it is forwardly biased in relation to a voltage developed, between the collector of said amplifying transistor and the output node of said reference voltage source, in accordance with an increase in an input current.

2. The transimpedance amplifier circuit according to claim 1, wherein said level shift circuit for producing a constant potential between the emitter of said amplifying transistor and the lower potential terminal includes an emitter resistor.

3. The transimpedance amplifier circuit according to claim 1, wherein said level shift circuit for producing a constant potential between the emitter of said amplifying transistor and the lower potential terminal includes a diode with an anode connected to the emitter of said amplifying transistor and a cathode connected to the lower potential terminal.

4. A transimpedance amplifier circuit for converting an input current to an output voltage, said transimpedance amplifier circuit comprising:

an input terminal and an output terminal;

an amplifying transistor having a base connected to said input terminal, an emitter connected to a lower potential terminal through a level shift circuit, and a collector connected to a higher potential terminal through a load resistor;

a feedback resistor connected between said input terminal and said output terminal;

a feedback resistor variable circuit connected in parallel to said feedback resistor, for varying an effective feedback resistance value of said feedback resistor when a level of an input signal inputted to said input terminal is larger than a predetermined level, said feedback resistor variable circuit including a resistor and a P-N junction diode connected in series, a resistance value of said resistor being smaller than that of said feedback resistor, and said P-N junction diode being connected such that it is forwardly biased in relation to a voltage developed across said feedback resistor which is determined by a polarity of an input current flowing at the input terminal; and a load resistor variable circuit connected to the collector of said amplifying transistor, for varying an effective load resistance value of said amplifying transistor when a level of an input signal inputted to said input terminal is larger than a predetermined level.

5. A transimpedance amplifier circuit for converting an input current to an output voltage, said transimpedance amplifier circuit comprising:

an input terminal and an output terminal;

an amplifying transistor having a base connected to said input terminal, an emitter connected to a lower potential terminal through a level shift circuit, and a collector connected to a higher potential terminal through a load resistor;

a feedback resistor connected between said input terminal and said output terminal;

a feedback resistor variable circuit connected in parallel to said feedback resistor, for varying an effective feedback resistance value of said feedback resistor when a level of an input signal inputted to said input terminal is larger than a predetermined level; and a load resistor variable circuit connected to the collector of said amplifying transistor, for varying an effective load resistance value of said amplifying transistor when a level of an input signal inputted to said input terminal is larger than a predetermined level, said load resistor variable circuit including a reference voltage source for outputting at an output node thereof an output potential which substantially equals a collector potential of said amplifying transistor when an input current at said input terminal is zero or very small, said reference voltage source comprising a plurality of diodes and at least one resistor which are connected in series between said higher potential terminal and said lower potential terminal, and a series circuit of a P-N junction diode and a resistor connected between said output node of said reference voltage source and the collector of said amplifying transistor, a resistance value of said resistor being smaller than that of said load resistor and said P-N junction diode being connected such that it is forwardly biased in relation to a voltage developed, between the collector of said amplifying transistor and the output node of said reference voltage source, in accordance with an increase in an input current.

6. A transimpedance amplifier circuit for converting an input current to an output voltage, said transimpedance amplifier circuit comprising:

at least a first stage transimpedance amplifier and a second stage transimpedance amplifier, each of said first and second stage transimpedance amplifiers having:

an input terminal and an output terminal;

an amplifying transistor having a base connected to said input terminal, an emitter connected to a lower potential terminal through a level shift circuit, and a collector connected to a higher potential terminal through a load resistor;

a feedback resistor connected between said input terminal and said output terminal;

a feedback resistor variable circuit connected in parallel to said feedback resistor, for varying an effective feedback resistance value of said feedback resistor when a level of an input signal inputted to said input terminal is larger than a predetermined level; and a load resistor variable circuit connected to the collector of said amplifying transistor, for varying an effective load resistance value of said amplifying transistor when a level of an input signal inputted to said input terminal is larger than a predetermined level; and a voltage-current converting circuit connected between the output terminal of said first stage transimpedance amplifier and the input terminal of said second stage transimpedance amplifier.

7. The transimpedance amplifier circuit according to claim 6, wherein said voltage-current converting circuit includes a resistor.

* * * * *